(12) United States Patent
Tanizaki et al.

(10) Patent No.: US 6,597,040 B2
(45) Date of Patent: Jul. 22, 2003

(54) SEMICONDUCTOR DEVICE HAVING MOS TRANSISTOR FOR COUPLING TWO SIGNAL LINES

(75) Inventors: Hiroaki Tanizaki, Hyogo (JP); Masatoshi Ishikawa, Hyogo (JP)

(73) Assignees: Mitsubishi Denki Kabushiki Kaisha, Tokyo (JP); Mitsubishi Electric Engineering Company Limited, Tokyo (JP)

( * ) Notice: Subject to any disclaimer, the term of this patent is extended or adjusted under 35 U.S.C. 154(b) by 0 days.

(21) Appl. No.: 09/740,857

(22) Filed: Dec. 21, 2000

(65) Prior Publication Data

US 2002/0003263 A1 Jan. 10, 2002

(30) Foreign Application Priority Data

Jun. 29, 2000 (JP) ......................... 2000-195963

(51) Int. Cl.⁷ .......................... H01L 29/76; H01L 29/94
(52) U.S. Cl. ........................ 257/368; 257/296; 257/297; 257/298
(58) Field of Search ................. 257/368, 296, 257/401, 321, 300, 314, 297–313

(56) References Cited

U.S. PATENT DOCUMENTS

| | | | | | |
|---|---|---|---|---|---|
| 4,733,112 A | * | 3/1988 | Yamaguchi | ................... | 327/52 |
| 5,027,325 A | * | 6/1991 | Katsura | ...................... | 365/205 |
| 5,420,812 A | * | 5/1995 | You | ............................ | 365/183 |
| 5,677,871 A | * | 10/1997 | Pio et al. | ............... | 365/185.11 |
| 5,793,677 A | * | 8/1998 | Hu et al. | ............... | 365/185.17 |
| 5,892,379 A | * | 4/1999 | Buxo et al. | ................. | 327/112 |
| 5,912,489 A | * | 6/1999 | Chen et al. | .................. | 257/321 |
| 6,154,402 A | * | 11/2000 | Akita | ......................... | 365/203 |
| 6,157,249 A | * | 12/2000 | Anami | ........................ | 327/565 |
| 6,288,590 B1 | * | 9/2001 | Sandhu | ....................... | 327/318 |
| 6,333,884 B1 | * | 12/2001 | Kato et al. | .................. | 365/208 |
| 6,359,473 B1 | * | 3/2002 | You et al. | ..................... | 327/52 |
| 6,518,835 B2 | * | 2/2003 | Riho et al. | ................... | 327/565 |

FOREIGN PATENT DOCUMENTS

JP      8-70247      3/1996

\* cited by examiner

Primary Examiner—Stephen D. Meier
Assistant Examiner—Ida M. Soward
(74) Attorney, Agent, or Firm—McDermott, Will & Emery

(57) ABSTRACT

A read gate of a DRAM core cell includes first and second N channel MOS transistors having gates connected to a pair of bit lines through first and second nodes, respectively, and third and fourth MOS transistors having gates both of which receive a column selecting signal, with gate oxide films of the third and the fourth N channel MOS transistors being formed to be thinner than gate oxide films of the first and the second N channel MOS transistors. It is accordingly possible to lower an amplitude voltage of the column selecting signal, thereby enabling reduction of electric current consumption and speed-up of an operating rate of the DRAM core cell.

6 Claims, 9 Drawing Sheets

US 6,597,040 B2

SEMICONDUCTOR DEVICE HAVING MOS TRANSISTOR FOR COUPLING TWO SIGNAL LINES

BACKGROUND OF THE INVENTION

1. Field of the Invention

The present invention relates to a semiconductor device and, more particularly, to a semiconductor device having first and second signal lines and a MOS transistor for coupling the lines.

2. Description of the Background Art

System LSIs have been developed which are mounted with DRAM core cells and logic circuits. In order to improve a data transfer rate, input and output of hundreds of bits of data at a time is enabled between a DRAM core cell and a logic circuit. In addition, an input terminal for a one-bit write mask signal is provided for every plurality of bits, and controlling of the write mask signal enables rewriting of data of memory cells of the corresponding plurality of bits to be inhibited.

FIG. 12 is a block diagram showing an entire structure of such a DRAM core cell 30. In FIG. 12, the DRAM core cell 30 includes a row/column address buffer+clock generation circuit 31, a row/column decoder circuit 32, a memory mat 33 and a data input/output circuit 34. In the DRAM core cell 30, 8 k bits of data DQ1-8 k (k: integer not less than 1) can be input and output at a time and an input terminal for a one-bit write mask signal WM is provided for every 8 bits of data.

The row/column address buffer+clock generation circuit 31 generates row address signals RA0–m, column address signals CA0–CAm, a read clock signal CLKR and a write clock signal CLKW in accordance with external address signals A0–Am (m: integer not less than 0) and external control signals /RAS, /CAS, /WE to control the entire DRAM core cell 30.

The memory mat 33 includes a plurality of sense amplifier bands SA1–SA3 and memory cell arrays MA1 and MA2 arranged between the bands. The memory cell arrays MA1 and MA2 each include a plurality of memory cells for storing one bit of data. The plurality of memory cells are grouped by a predetermined number, 8 k bits. Each memory group is arranged at a predetermined address deter-mined by a row address and a column address.

The row/column decoder circuit 32 designates addresses of the memory cell arrays MA1 and MA2 in accordance with the row address signals RA0–RAm and the column address signals CA0–CAm applied from the row/column address buffer+clock generation circuit 31. In the sense amplifier bands SA1 and SA2, a sense amplifier+input/output control circuit group which will be described later is provided. The sense amplifier+input/output control circuit group connects the number 8 k of memory cells at the addresses designated by the row/column decoder circuit 32 to the data input/output circuit 34. The data input/output circuit 34 includes a write driver+read amplifier band 35 and an input/output buffer group 36. In the write driver+read amplifier band 35, a write driver group and a read amplifier group are provided.

The read amplifier group operates in synchronization with the read clock signal CLKR to apply read data Q1–Q8k from the number 8 k of selected memory cells to the input/output buffer group 36. The input/output buffer group 36 externally outputs the read data Q1–Q8k from the read amplifier group in response to an external control signal /OE. The write driver group operates in synchronization with the write clock signal CLKW to write external write data D1–D8k into the number 8 k of selected memory cells. Of the number 8 k of memory cells, no data will be written into the memory cells designated by write mask signals WM1–WMk.

Each of the memory cell arrays MA1 and MA2 includes the number 8 k of memory blocks MB provided corresponding to the data DQ1–DQ8k. Each memory block MB, as shown in FIG. 13, includes a plurality of memory cells MC arranged in a plurality of rows and columns, a plurality of word lines WL provided corresponding to the plurality of rows, and a plurality of bit line pairs BL, /BL provided corresponding to the plurality of columns. The memory cell MC is a known MC including an N channel MOS transistor Q for access and a capacitor C for information storage.

When a word line WL corresponding to the row address signal RA0–RAm is brought to a logical high or a "H" level as a selection level by the row/column decoder circuit 32, an N channel MOS transistor Q of a memory cell MC at a row corresponding to the word line WL is rendered conductive to enable data writing/reading of the memory cell MC. In writing operation, after activating a memory cell MC by forcing one word line WL to a "H" level as the selection level, one bit line of a bit line pair BL, /BL is forced to a "H" level and the other to a logical low or a "L" level in accordance with the write data D. As a result, a potential of the bit line is written into a capacitor C of a desired memory cell MC. In reading operation, after equalizing potentials of the bit line pair BL, /BL to VBL (=VCC/2), the memory cell MC is activated by forcing one word line WL to a "H" level as the selection level. As a result, a minute potential difference is generated between BL and /BL of each bit line pair according to storage data of the memory cell MC. By amplifying a minute potential difference between bit lines of each pair to a power supply voltage Vdds and then detecting a potential difference between bit lines of one bit line pair, data in a desired memory cell MC can be read. The number 8 k of memory blocks MB are arrayed in a direction in which the word lines extend and the word lines WL are shared by the number 8 k of memory blocks MB.

FIG. 14 is a circuit block diagram showing a structure of a part related to writing/reading of the data DQ1. In FIG. 14, provided are a write driver 37 and a write data line pair GIOW, /GIOW for the writing of the data D1, and a read amplifier 38 and a read data line pair GIOR, /GIOR for the reading of the data Q1.

The write driver 37 is arranged in the write driver+read amplifier band 35 shown in FIG. 12 for forcing one of the write data lines GIOW and /GIOW to a "H" level and the other to a "L" level in accordance with the write data D1 in writing operation. The read amplifier 38 is arranged in the write driver+read amplifier band 35 for detecting a potential difference between a read data line pair GIOR, /GIOR to generate the read data Q1 and externally output the same through the output buffer in reading operation.

The write data line pair GIOW, /GIOW is arranged to cross the memory arrays MA1 and MA2 and the sense amplifier bands SA1–SA3 shown in FIG. 12 and has its one end connected to the write driver 37. The read data line pair GIOR, /GIOR is arranged to cross the memory arrays MA1 and MA2 and the sense amplifier bands SA1–SA3 and has its one end connected to the read amplifier 38.

A sense amplifier+input/output control circuit 40 is provided commonly for one pair of bit lines BL1 and /BL1 included in a memory block MB of the memory cell array MA1 and one pair of bit lines BL2 and /BL2 included in a memory block MB of the memory cell array MA2. The sense amplifier+input/output control circuit 40 is provided, for example, for each odd-numbered bit line pair BL, /BL of the memory cell arrays MA1 and MA2 and arranged at the sense amplifier band SA2. Sense amplifier+input/output control circuits each for each even-numbered bit line pair BL, /BL of the memory cell arrays MA1 and MA2 are arranged in the sense amplifier bands SA1 and SA3, respectively.

The sense amplifier+input/output control circuit 40 includes N channel MOS transistors 41 to 44, equalizers 45 and 46, a sense amplifier 47, a write gate 50 and a read gate 60. The N channel MOS transistors 41 and 42 are connected between the bit lines BL1 and /BL1 of the memory cell array MA1 and nodes N1 and N2, respectively, and each have a gate receiving a signal SHR1. The N channel MOS transistors 43 and 44 are connected between the bit lines BL2 and /BL2 of the memory cell array MA2 and the nodes N1 and N2, respectively, and each have a gate receiving a signal SHR2. When the signal SHR1 attains a "H" level as an activation level, the N channel MOS transistors 41 and 42 become conductive to cause the sense amplifier+input/output control circuit 40 to be coupled with the bit line pair BL1, /BL1 of the memory cell array MA1. When the signal SHR2 attains a "H" level as the activation level, the N channel MOS transistors 43 and 44 become conductive to cause the sense amplifier+input/output control circuit 40 to be coupled with the bit line pair BL2, /BL2 of the memory cell array MA2.

The equalizer 45 is activated to equalize potentials of the bit line pair BL1, /BL1 of the memory cell array MA1 to the bit line potential VBL (=Vdds/2) when a signal BLEQ1 is at a "H" level as the activation level. The equalizer 46 is activated to equalize potentials of the bit line pair BL2, /BL2 of the memory cell array MA2 to the bit line potential VBL when a signal BLEQ is at a "H" level as the activation level. The sense amplifier 47 is activated in response to signals SE and /SE attaining a "H" level and a "L" level as the activation level, respectively, to amplify a potential difference between the bit line pair BL1, /BL1 or BL2, /BL2 connected to the nodes N1 and N2 by the N channel MOS transistors 41 and 42 or 43 and 44 to the power supply voltage Vdds.

The write gate 50 includes N channel MOS transistors 51–54. The N channel MOS transistors 51 and 52 are connected in series between the write data line GIOW and the node N1 and have gates which receive the signals WM1 and CSLW, respectively. The N channel MOS transistors 53 and 54 are connected in series between the write data line /GIOW and the node N2 and have gates which receive the signals WM1 and CSLW, respectively.

When the column selecting signal CSLW attains a "H" level as the selection level, the N channel MOS transistors 52 and 54 become conductive. When the write mask signal WM1 is at a "L" level, the N channel MOS transistors 51 and 53 become non-conductive to inhibit writing of the data D1. When the write mask signal WM1 is at a "H" level, the N channel MOS transistors 51 and 53 become conductive to allow writing of the data D1.

The read gate 60 includes N channel MOS transistors 61–64. The N channel MOS transistors 61 and 62 are connected in series between a line of a ground potential GND and the read data line /GIOR, while the N channel MOS transistors 63 and 64 are connected in series between the line of the ground potential GND and the read data line GIOR. The N channel MOS transistors 61 and 63 have gates connected to the nodes N1 and N2, respectively, and the N channel MOS transistors 62 and 64 have gates both of which receive a signal CLSR.

When the column selecting signal CSLR attains a "H" level as the selection level, the N channel MOS transistors 62 and 64 become conductive. When the nodes N1 and N2 are at a "H" level and a "L" level, respectively, the N channel MOS transistor 61 becomes conductive and the N channel MOS transistor 63 becomes non-conductive, so that of the read data lines GIOR and /GIOR precharged to a "H" level, the read data line /GIOR is grounded. When the nodes N1 and N2 are at a "L" level and a "H" level, respectively, the N channel MOS transistor 63 becomes conductive and the N channel MOS transistor 61 becomes non-conductive, so that of the read data lines GIOR and /GIOR precharged to a "H" level, the read data line GIOR is ground.

Next, operation of a part related to writing/reading of the data DQ1 shown in FIG. 14 will be described. Description will be here made of a case where a bit line pair BL1, /BL1 of the memory cell array MA1 is selected. It is assumed that the write mask signal WM1 is at a "H" level.

In writing operation, first the signal SHR2 attains a "L" level as an inactivation level, so that the N channel MOS transistors 43 and 44 become non-conductive to cause the nodes N1 and N2 to be cut off from the memory cell array MA2. In addition, the bit line equalizing signal BLEQ1 attains a "L" level as the inactivation level to inactivate the equalizer 45, so that equalization of the bit line pair BL1,/BL1 of the memory cell array MA1 is stopped.

Next, a column selecting signal CSLW corresponding to the column address signal CA1–CAm is brought to a "H" level as the selection level, so that the write gate 50 corresponding to the column selecting signal CSLW becomes conductive to cause the write data line pair GIOW, /GIOW to be coupled with the bit line pair BL1, /BL1 through the write gates 50, the nodes N1 and N2 and the N channel MOS transistors 41 and 42. In addition, the write driver 37 brings one of the write data lines GIOW and /GIOW to a "H" level and the other to a "L" level in accordance with the write data D1.

Next, the sense amplifier activation signals SE and /SE are forced to a "H" level and a "L" level as the activation level, respectively, to activate the sense amplifier 47, so that a potential difference between the bit line pair BL1, /BL1 is amplified to the power supply voltage Vdds by the sense amplifier 47. Also, a word line WL corresponding to the row address signal RA0–RAm is brought to a "H" level as the selection level to activate a memory cell MC corresponding to the word line WL, so that the potential of the bit line BL1 or /BL1 is written into the memory cell MC.

In reading operation, first the signal SHR2 attains a "L" level as the inactivation level to render the N channel MOS transistors 43 and 44 non-conductive, so that the nodes N1 and N2 are cut off from the memory cell array MA2. In addition, the bit line equalizing signal BLEQ1 attains a"L" level as the inactivation level to inactivate the equalizer 45, so that equalization of the bit line pair BL1, /BL1 of the memory cell array MA1 is stopped.

Next, a word line WL corresponding to the row address signal RA0–RAm is brought to a "H" level as the selection level to activate a memory cell MC corresponding to the word line WL, so that a minute potential difference is generated between the bit line pair BL1, /BL1 in accordance with the storage data of the memory cell MC.

Next, the sense amplifier activation signals SE and /SE are brought to a "H" level and a "L" level as the activation level to activate the sense amplifier 47, so that a potential difference between the bit lines BL1 and /BL1 is amplified to the power supply voltage Vdds. More specifically, of the bit lines BL1 and /BL1, a bit line whose potential is higher than the precharge potential Vdds/2 is set at the power supply potential Vdds and the remaining bit line is set at the ground potential GND. As a result, either the N channel MOS transistor 61 or 63 of the read gate 60 becomes conductive and the other becomes non-conductive.

Subsequently, a column selecting signal CSLR corresponding to the column address signal CA0–CAm is brought to a "H" level as the selection level to render the N channel MOS transistors 62 and 64 of the read gate 60 corresponding to the column selecting signal CSLR conductive, so that one of the read data lines GIOR and /GIOR precharged in advance to a "H" level is grounded through the N channel MOS transistors 62 and 61, or 64 and 63 to attain a "L" level. The read amplifier 38 detects a potential difference between the read data line pair GIOR, /GIOR to generate the data Q1 of a logic corresponding to the detection result and externally output the same through the output buffer.

Conventionally, since amplitude voltages of the bit lines BL and /BL, amplitude voltages of the data lines GIOW,/GIOW, GIOR and /GIOR and amplitude voltages of the column selecting signals CSLW and CSLR are the same, MOS transistors having the same breakdown voltage, that is, having a gate oxide film of the same thickness are used for the write gate 50, the read gate 60 and the sense amplifier 47.

In recent years, however, as a peripheral power supply of the DRAM core cell 30 is designed to have a lower voltage and the number of the data lines GIOW, /GIOW, GIOR and/GIOR and the column selecting signals CSLW and CSLR is increased, it is necessary to set these amplitude voltages to be the same as a peripheral power supply voltage, thereby reducing consumption of electricity.

Simply decreasing amplitude voltages of the column selecting signals CSLW and CSLR, however, leads to reduction in a source-drain current Id flowing through the N channel MOS transistors 52, 54, 62 and 64 to slow down writing/reading operation.

Another possible method is amplifying an amplitude of column selecting signals CSLW and CSLR whose amplitude voltage is low by a level converting circuit, which requires time for level conversion to slow down writing/reading operation.

On the other hand, since it is necessary to write as high a voltage as possible into a capacitor C of a memory cell MC to make a data holding time longer, it is undesirable to reduce a power supply voltage Vdds for the sense amplifier 47. Accordingly, uniformly thinning a gate oxide film of a MOS transistor for increasing a source-drain current Id results in breakdown of the MOS transistor by the power supply voltage Vdds for the sense amplifier 47.

SUMMARY OF THE INVENTION

An object of the present invention is to provide a semiconductor device having low current consumption and a high operating rate.

A semiconductor device according to the present invention includes a first signal line supplied with a signal having one level at a first potential and the other level at a reference potential, a second signal line precharged to a second potential predetermined, a first MOS transistor having an input electrode connected to the first signal line and responsive to a potential of the first signal line exceeding its threshold potential to become conductive, and a second MOS transistor responsive to application of a control signal which allows transmission of a signal on the first signal line to the second signal line to become conductive to connect the first MOS transistor between the second signal line and a line of the reference potential, with a gate oxide film of the second MOS transistor formed to be thinner than that of the first MOS transistor. Since the gate oxide film of the second MOS transistor is made thin, an amplitude voltage of the control signal can be lowered to reduce electricity consumption. In addition, since no level converting circuit for amplifying the control signal whose voltage is reduced is necessary, operating rate will not be lowered. Also, reduction in the size of the second transistor is possible to realize reduction in a chip area.

Preferably, the semiconductor device according to the present invention further includes a third signal line supplied with a complementary signal of the signal applied to the first signal line, a fourth signal line to be precharged to the second potential, a third MOS transistor having an input electrode connected to the third signal line and responsive to a potential of the third signal line exceeding its threshold potential to become conductive, and a fourth MOS transistor responsive to application of the control signal to become conductive to connect the third MOS transistor between the fourth signal line and the line of the reference potential, with a gate oxide film of the fourth MOS transistor formed to be thinner than that of the third MOS transistor. In this case, the signals and their complementary signals can be transmitted.

Also preferably, the semiconductor device of the present invention includes the first and the second MOS transistors connected in series between the second signal line and the line of the reference potential, the third signal line supplying a complementary signal of the signal applied to the first signal line, the fourth signal line precharged to the second potential, and a third MOS transistor having a first electrode connected to the fourth signal line, a second electrode connected to a node between the first and the second MOS transistors and an input electrode connected to the third signal line, and responsive to a potential of the third signal line exceeding its threshold potential to become conductive, with a gate oxide film of the second MOS transistor formed to be thinner than that of the third MOS transistor. In this case, the signals and their complementary signals can be transmitted. In addition, because the second MOS transistor is shared by the first and the third MOS transistors, a less number of transistors are required.

Another semiconductor device according to the present invention includes a first signal line supplied with a signal having one level at a first potential and the other level at a reference potential, a second signal line precharged to a second potential predetermined, a sense amplifier for amplifying a potential difference between a potential of the second signal line and the second potential and applying a signal having one level at a third potential higher than the first potential and the other level at the reference potential to the second signal line, a first MOS transistor having a first electrode connected to the first signal line and responsive to application of a first control signal allowing a signal on the first signal line to be transmitted onto the second signal line to become conductive, and a second MOS transistor connected between a second electrode of the first MOS transistor and the second signal line and responsive to application of a second control signal inhibiting a signal on the first signal line to be transmitted onto the second signal line to become non-conductive, with a gate oxide film of the first MOS transistor formed to be thinner than that of the second MOS transistor. Since the gate oxide film of the first MOS transistor is made thin, an amplitude voltage of the first control signal can be lowered to reduce electricity consumption. In addition, since no level converting circuit for amplifying the first control signal whose voltage is reduced is necessary, operating rate will not be lowered. Also, reduction in the size of the first transistor is possible to realize reduction in a chip area.

A further semiconductor device according to the present invention includes a first signal line supplied with a signal having one level at a first potential and the other level at a reference potential, a second signal line precharged to a second potential predetermined, a sense amplifier for amplifying a potential difference between a potential of the second signal line and the second potential and applying a signal having one level at a third potential higher than the first potential and the other level at the reference potential to the second signal line, a first MOS transistor having a first electrode connected to the first signal line and responsive to application of a control signal allowing a signal on the first signal line to be transmitted onto the second signal line to become conductive, and a second MOS transistor connected between a second electrode of the first MOS transistor and the second signal line and receiving the third potential at its input electrode and being kept conductive, with a gate oxide film of the first MOS transistor formed to be thinner than that of the second MOS transistor. Since the gate oxide film of the first MOS transistor is made thin, an amplitude voltage of the control signal can be lowered to reduce electricity consumption. In addition, even when a potential of the second signal line is set at the third potential by the sense amplifier, dielectric breakdown of the first MOS transistor can be prevented because a potential lower than the third potential by a threshold voltage of the second MOS transistor is applied to the first MOS transistor.

Also preferably, each MOS transistor includes a gate oxide film and an active region formed on a surface of a semiconductor substrate and an active region of a MOS transistor having a relatively thick gate oxide film and an active region of a MOS transistor having a relatively thin gate oxide film are formed separately from each other. In this case, improvement of reliability and reduction of a layout area can be realized.

PREFERRED EMBODIMENT OF THE PRESENT INVENTION

Figure 1:
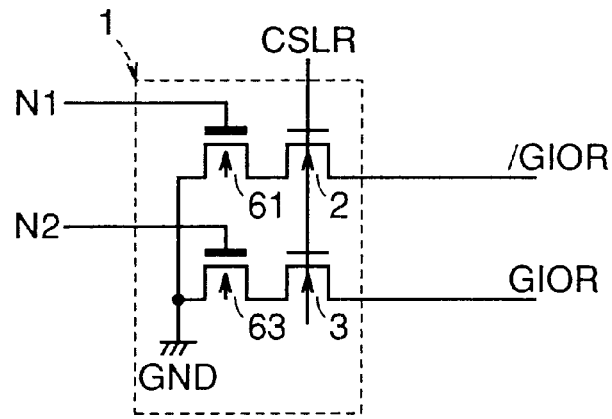
FIG. 1 is a circuit diagram showing a structure of a read gate of a DRAM core cell according to a first embodiment of the present invention.
Figure 14:
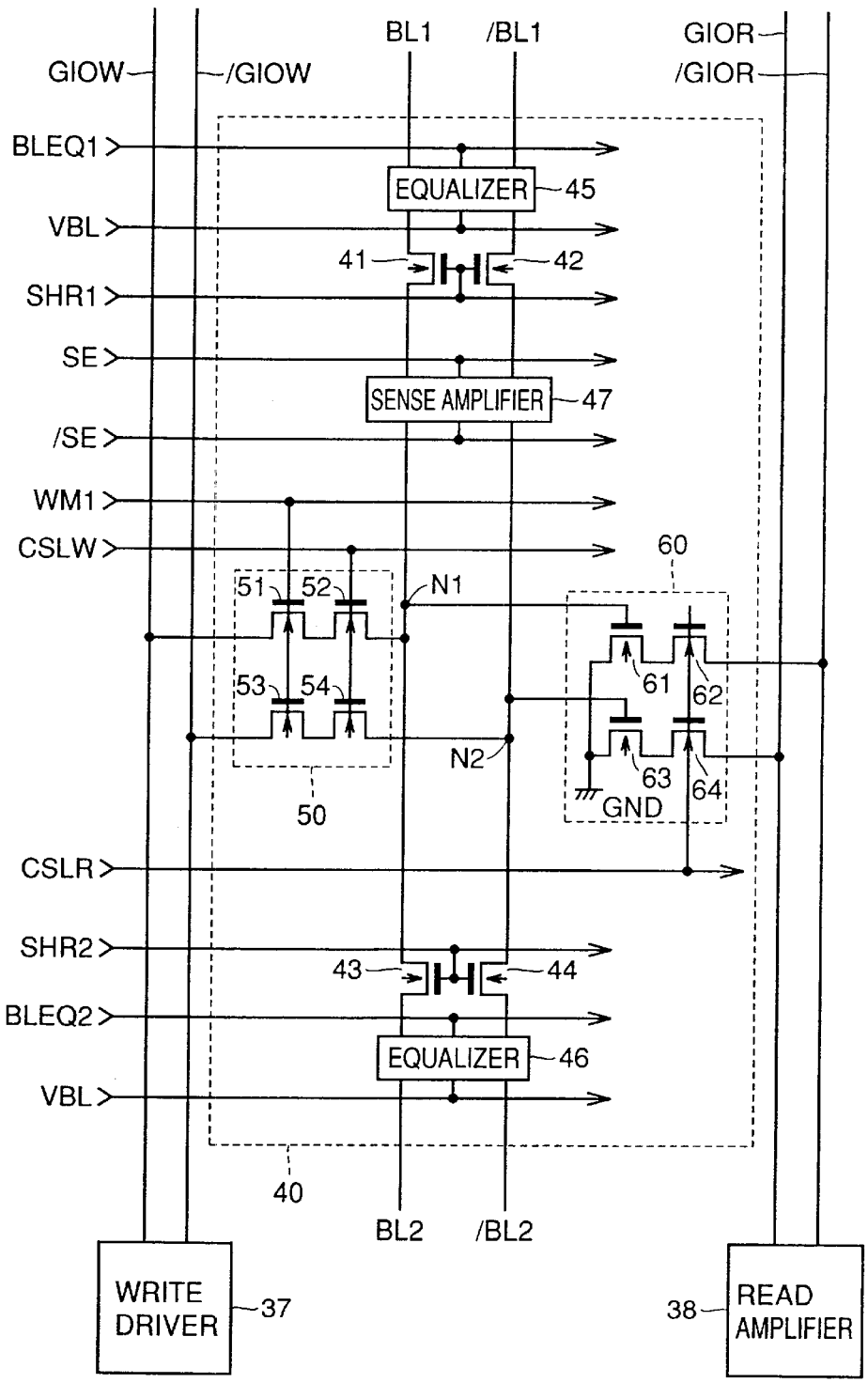
FIG. 14 is a circuit block diagram showing a structure of a part related to writing/reading of data DQ1 shown in FIG. 12.

FIG. 1 is a circuit diagram showing a structure of a read gate 1 of a DRAM core cell according to a first embodiment of the present invention, which is to be compared with the read gate 60 in FIG. 14.

In FIG. 1, the difference of the read gate 1 from the conventional read gate 60 is that the N channel MOS transistors 62 and 64 are replaced by N channel MOS transistors 2 and 3. The N channel MOS transistor 2 is connected between a drain of an N channel MOS transistor 61 and a read data line /GIOR and has a gate which receives a column selecting signal CSLR. The N channel MOS transistor 3 is connected between a drain of an N channel MOS transistor 63 and a read data line GIOR and has a gate which receives the column selecting signal CSLR.

An amplitude voltage of the column selecting line CSLR, that is, a voltage of a difference between a "H" level and a "L" level is 1.5V, the same as that of a peripheral power supply. An amplitude voltage of the read data lines GIOR and /GIOR is 1.5V, the same as that of the peripheral power supply. An amplitude voltage of bit lines BL and /BL, that is, a voltage Vdds for a sense amplifier 47, is 2.0V.

Figure 2A:
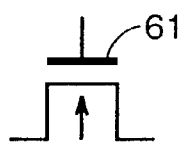
FIGS. 2A to 2D are diagrams showing structures of two kinds of N channel MOS transistors 2 and 61 shown in FIG. 1.
Figure 2C:
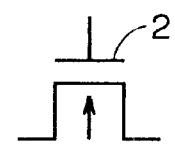
Figure 2B:
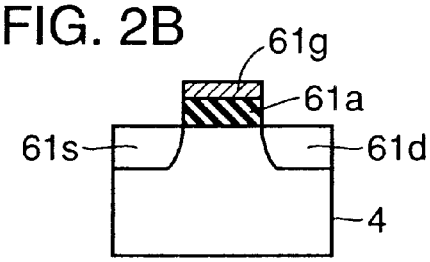

The N channel MOS transistor 61, as shown in FIGS. 2A and 2B, has a gate oxide film 61a of a relatively large thickness (e.g. 7.5 nm). The gate oxide film 61a is formed on the surface of a semiconductor substrate 4. On the gate oxide film 61a, a gate electrode 61g is formed, from one side of which to the other side active regions are formed. An active region on one side of the gate oxide film 61g forms a source 61s of the MOS transistor 61 and that on the other side forms a drain 61d of the N channel MOS transistor 61. The N channel MOS transistor 63 has the same structure as that of the N channel MOS transistor 61.

Figure 2D:
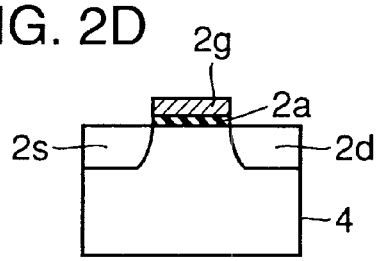

The N channel MOS transistor, as shown in FIGS. 2C and 2D, has a gate oxide film 2a of a relatively small thickness (e.g. 3.0 nm). The gate oxide film 2a is formed on the surface of the semiconductor substrate 4. On the gate oxide film 2a, a gate electrode 2g is formed, from one side of which to the other side active regions are formed. An active region on one side of the gate oxide film 2g forms a source 2s of the MOS transistor 2 and that on the other side forms a drain 2d of the MOS transistor 2.

Figure 3:
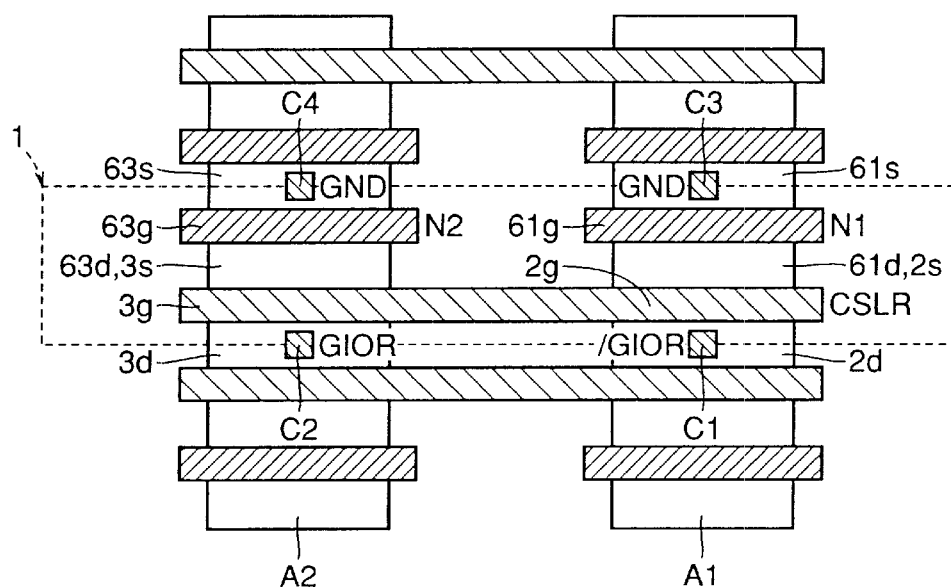
FIG. 3 is a diagram showing layout of the read gate shown in FIG. 1.

FIG. 3 is a diagram showing layout of the read gate 1 shown in FIG. 1. In FIG. 3, one electrode is formed on the surface of the semiconductor substrate with a thin gate insulation film provided therebetween. One end of the electrode forms the gate electrode 2g of the N channel MOS transistor 2 and the other end forms a gate electrode 3g of the N channel MOS transistor 3. On the substrate surface in the vicinity of the gate electrode 2g, the gate electrode 61g of the N channel MOS transistor 61 is formed with a thick gate insulation film provided therebetween and on the substrate surface in the vicinity of the gate electrode 3g, a gate electrode 63g of the N channel MOS transistor 63 is formed with a thick gate oxide film provided therebetween. The gate electrodes 2g and 3g receive the column selecting signal CSLR. The gate electrodes 61g and 63g are connected to nodes N1 and N2, respectively.

Between and opposite sides of the gate electrodes 2g and 61g, an active region A1 is formed and between and opposite sides of the gate electrodes 3g and 63g, an active region A2 is formed. A region between the gate electrodes 2g and 61g forms the source 2s of the N channel MOS transistor 2 and the drain 61d of the N channel MOS transistor 61. A region between the gate electrodes 3g and 63g forms a source 3s of the N channel MOS transistor 3 and a drain 63d of the N channel MOS transistor 63. Drains 2d and 3d of the N channel MOS transistors 2 and 3 are connected to the upper layer read data lines /GIOR and GIOR through contact holes C1 and C2, respectively. Sources 61s and 63s of the N channel MOS transistors 61 and 63 are connected to an upper layer line of a ground potential GND through contact holes C3 and C4, respectively.

In the first embodiment, since of the four N channel MOS transistors included in the read gate 1, as the two N channel MOS transistors 2 and 3 which receive the column selecting signal CSLR at their gates, thin gate insulation films are used, it is possible to set an amplitude voltage of the column selecting signal CSLR to be the same low voltage as that of a peripheral power supply to enable reduction in electricity consumption. In addition, since even if an amplitude voltage of the column selecting signal CSLR is lowered, no level converting circuit is necessary for increasing the amplitude voltage, no reduction in reading operation is involved. Also, because a large source-drain current can be obtained by the column selecting signal CSLR of a low voltage, the N channel MOS transistors 2 and 3 can be made small in size. Furthermore, because an amplitude voltage of the read data line pair GIOR, /GIOR is set to be as low as that of a peripheral power supply, a drastic reduction in electricity consumption is possible.

[Second Embodiment]

Although in the first embodiment, two kinds of N channel MOS transistors 2 and 61 whose gate oxide film thicknesses are different are formed in the same active region (e.g. A1), this method requires a space between the gate electrodes 2g and 61g to be increased to increase an layout area. In addition, when a mask is displaced, impurity concentrations of the two N channel MOS transistors 2 and 61 might change, which causes a problem in reliability. The second embodiment solves these problems.

Figure 4:
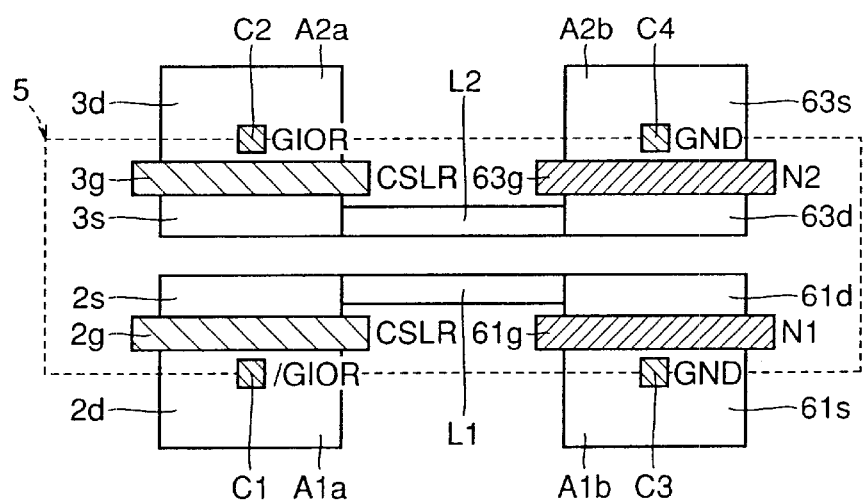
FIG. 4 is a diagram showing layout of a read gate of a DRAM core cell according to a second embodiment of the present invention.

FIG. 4 is a diagram showing layout of a read gate 5 of a DRAM core cell according to the second embodiment of the present invention. The circuit diagram of the read gate 5 is the same as that of the read gate 1 shown in FIG. 1.

In FIG. 4, on the surface of a semiconductor substrate, gate electrodes 61g and 63g of N channel MOS transistors 61 and 63 are formed in parallel to each other with a thick gate oxide film provided therebetween. In addition, on the surface of the semiconductor substrate, gate electrodes 2g and 3g of N channel MOS transistors 2 and 3 are formed in parallel to each other with a thin gate oxide film provided therebetween. The gate electrodes 61g and 2g, and the gate electrodes 63g and 3g are respectively formed at predetermined intervals on the same straight lines. The gate electrodes 2g and 3g receive a column selecting signal CSLR and the gate electrodes 61g and 63g are connected to nodes N1 and N2, respectively.

On opposite sides of the gate electrodes 2g, 3g, 61g and 63g, active regions A1a, A2a, A1b and A2b are respectively formed spaced apart from each other. In the active regions A1a and A2a, the regions between the gate electrodes 2g and 3g form sources 2s and 3s of the N channel MOS transistors 2 and 3, respectively, and regions outside the gate electrodes 2g and 3g form drains 2d and 3d of the N channel MOS transistors 2 and 3, respectively. In the active regions A1b and A2b, regions between the gate electrodes 61 and 63g form sources 61s and 63s of the N channel MOS transistors 61 and 63, respectively, and regions outside the gate electrodes 61g and 63g form drains 61d and 63d of the N channel MOS transistors 61 and 63, respectively.

The source 2s of the N channel MOS transistor 2 and the drain 61d of the N channel MOS transistor 61 are connected through an interconnection layer L1 formed of an active region. The source 3s of the N channel MOS transistor 3 and the drain 63d of the N channel MOS transistor 63 are connected through an interconnection layer L2 formed of an active region. The drains 2d and 3d of the N channel MOS transistors 2 and 3 are respectively connected to upper layer read data lines /GIOR and GIOR with contact holes C1 and C2 provided therebetween. The sources 61s and 63s of the N channel MOS transistors 61 and 63 are connected to an upper layer line of a ground potential GND through contact holes C3 and C4, respectively.

In the second embodiment, the two kinds of N channel MOS transistors having different gate oxide film thicknesses, transistors 2 and 61, and 3 and 63 are respectively formed of separate active regions A1a and A1b, and A2a and A2b, which are connected by the interconnection layers L1 and L2, respectively. It is accordingly possible to separately form the active regions A1a and A1b, and A2a and A2b, thereby improving reliability. Layout with the smallest area is also enabled.

[Third Embodiment]

Figure 5:
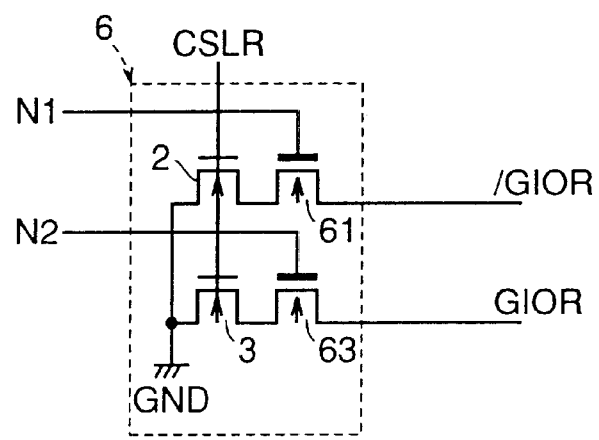
FIG. 5 is a circuit diagram showing a structure of a read gate of a DRAM core cell according to a third embodiment of the present invention.

FIG. 5 is a circuit diagram showing a structure of a read gate 6 of a DRAM core cell according to a third embodiment of the present invention.

With reference to FIG. 5, the difference of the read gate 6 from the read gate 1 shown in FIG. 1 is that the order of connection between N channel MOS transistors 2 and 61 and between 3 and 63 is reversed. The N channel MOS transistors 2 and 3 have sources both connected to a line of a ground potential GND and gates both of which receive a column selecting signal CSLR. The N channel MOS transistor 61 has a source connected to a drain of the N channel MOS transistor 2, a drain connected to a read data line /GIOR and a gate connected to a node N1. The N channel MOS transistor 63 has a source connected to a drain of the N channel MOS transistor 3, a drain connected to a read data line GIOR and a gate connected to a node N2.

Figure 6:
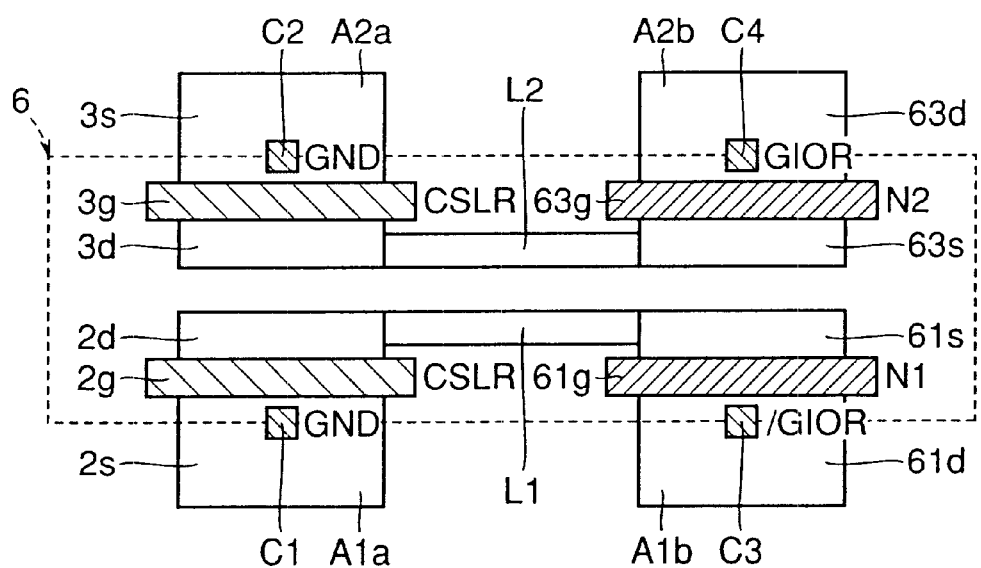
FIG. 6 is a diagram showing layout of the read gate shown in FIG. 5.

FIG. 6 is a diagram showing layout of the read gate 6 illustrated in FIG. 5. In FIG. 6, formed in parallel to each other on the surface of a semiconductor substrate with a thick gate oxide film provided therebetween are two gate electrodes 61g and 63g. Formed also in parallel to each other on the surface of the semiconductor substrate with a thin gate oxide film provided therebetween are two gate electrodes 2g and 3g. The gate electrodes 61g and 2g, and 63g and 3g are respectively formed at predetermined intervals on the same straight lines.

On opposite sides of the gate electrodes 2g, 3g, 61g and 63g, active regions A1a, A2a, A1b and A2b are formed respectively. In the active regions A1a and A2a, regions between the gate electrodes 2g and 3g form drains 2d and 3d of the N channel MOS transistors 2 and 3, respectively, and regions outside the gate electrodes 2g and 3g form sources 2s and 3s of the N channel MOS transistors 2 and 3, respectively. In the active regions A1b and A2b, regions between the gate electrodes 61g and 63g form sources 61s and 63s of the N channel MOS transistors 61 and 63, respectively, and regions outside the gate electrodes 61g and 63g form drains 61d and 63d of the N channel MOS transistors 61 and 63, respectively.

The drain 2d of the N channel MOS transistor 2 and the source 61s of the N channel MOS transistor 61 are connected by an interconnection layer L1 formed of an active region. The drain 3d of the N channel MOS transistor 3 and the source 63s of the N channel MOS transistor 63 are connected by an interconnection layer L2 formed of an active region. The sources 2s and 3s of the N channel MOS transistors 2 and 3 are connected to the upper layer line of the ground potential GND through contact holes C1 and C2, respectively. The drains 61d and 63d of the N channel MOS transistors 61 and 63 are connected to the upper layer read data lines /GIOR and GIOR through contact holes C3 and C4, respectively.

The third embodiment attains the same effects as those obtained by the second embodiment.

[Fourth Embodiment]

Figure 7:
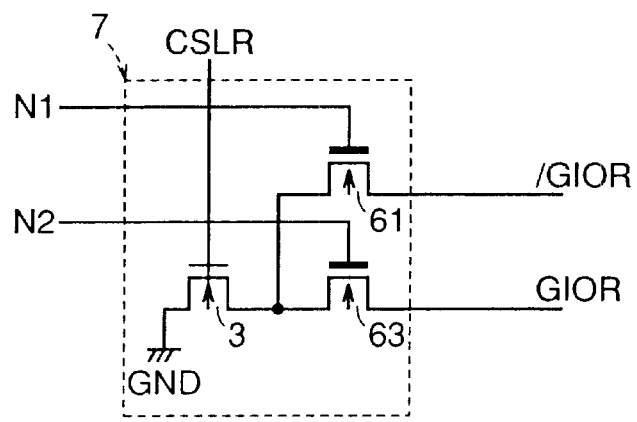
FIG. 7 is a circuit diagram showing a structure of a read gate of a DRAM core cell according to a fourth embodiment of the present invention.

FIG. 7 is a circuit diagram showing a structure of a read gate 7 of a DRAM core cell according to a fourth embodiment of the present invention. With reference to FIG. 7, the differences of the read gate 7 from the read gate 6 shown in FIG. 5 are that the N channel MOS transistor 2 is deleted and that a source of an N channel MOS transistor 61 is connected to a source of an N channel MOS transistor 63.

Figure 8:
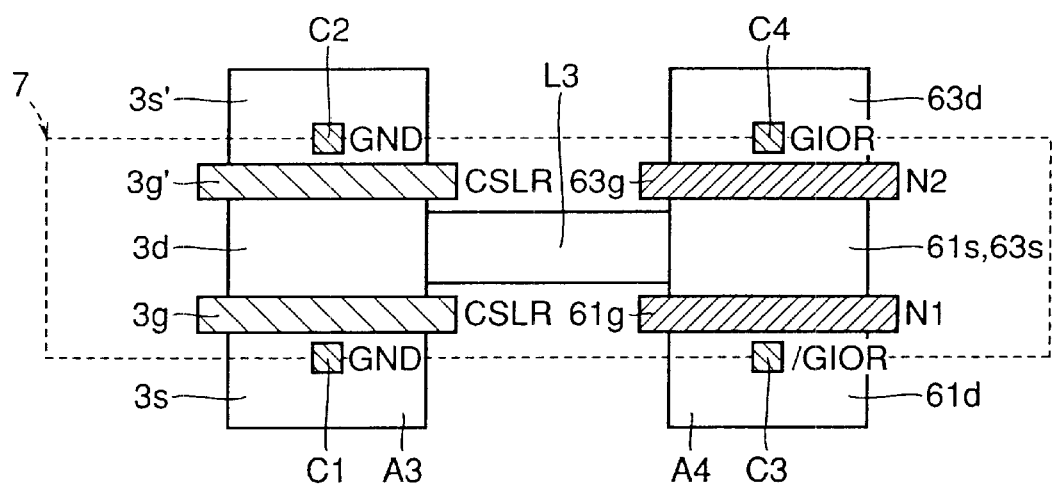
FIG. 8 is a diagram showing layout of the read gate shown in FIG. 7.

FIG. 8 is a diagram showing layout of the read gate 7 illustrated in FIG. 7. In FIG. 8, formed in parallel to each other on the surface of a semiconductor substrate with a thick gate oxide film provided therebetween are gate electrodes 61g and 63g of the N channel MOS transistors 61 and 63. Also formed in parallel to each other on the surface of the semiconductor substrate with a thin gate oxide film provided therebetween are two gate electrodes 3g and 3g' of an N channel MOS transistor 3. The gate electrodes 61g and 3g, and 63g and 3g' are respectively formed at predetermined intervals on same straight lines. The gate electrodes 3g and 3g' receive a column selecting signal CSLR and the gate electrodes 61g and 63g are connected to nodes N1 and N2, respectively.

An active region A3 is formed between and on opposite sides of the gate electrodes 3g and 3g', and an active region A4 is formed between and on opposite sides of the gate electrodes 61g and 63g. A region between the gate electrodes 3g and 3g' forms a drain 3d of the N channel MOS transistors 3 and regions outside the gate electrodes 3g and 3g' form sources 3s and 3s' of the N channel MOS transistor 3. Regions between the gate electrodes 61g and 63g form sources 61s and 63s of the N channel MOS transistors 61 and 63, respectively, and regions outside the gate electrodes 61g and 63g form drains 61d and 63d of the N channel MOS transistors 61 and 63, respectively.

The drain 3d of the N channel MOS transistor 3 and the sources 61s and 63s of the N channel MOS transistors 61 and 63 are connected by an interconnection layer L3 formed of an active region. The sources 3s and 3s' of the N channel MOS transistor 3 are connected to an upper layer line of a ground potential GND through contact holes C1 and C2, respectively. The drains 61d and 63d of the N channel MOS transistors 61 and 63 are connected to read data lines /GIOR and GIOR through contact holes C3 and C4, respectively.

The fourth embodiment attains the same effects as those obtained by the second embodiment.

[Fifth Embodiment]

Figure 9:
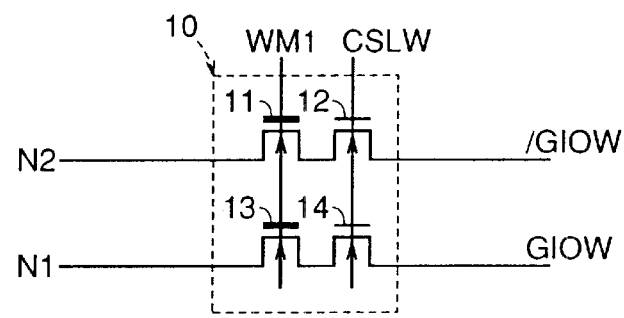
FIG. 9 is a circuit diagram showing a structure of a write gate of a DRAM core cell according to a fifth embodiment of the present invention.

FIG. 9 is a circuit diagram showing a structure of a write gate 10 of a DRAM core cell according to a fifth embodiment of the present invention, which is to be compared with the write gate 50 of FIG. 14.

In FIG. 9, the write gate 10 includes N channel MOS transistors 11 and 12 connected in series between a node N2 and a write data line /GIOW and N channel MOS transistors 13 and 14 connected in series between a node N1 and a write data line GIOW. The N channel MOS transistors 11 and 13 have a gate oxide film of a relatively large thickness (e.g. 7.5 nm). The N channel MOS transistors 12 and 14 have a gate oxide film of a relatively small thickness (e.g. 3.0 nm). Gates of the N channel MOS transistors 11 and 13 both receive a write mask signal WM1. Gates of the N channel MOS transistors 12 and 14 both receive a column selecting signal CSLW.

An amplitude voltage of the column selecting signal CSLW is 1.5V, the same as that of a peripheral power supply. An amplitude voltage of the write data lines GIOW and /GIOW is 1.5V, the same as that of the peripheral power supply. An amplitude voltage of the nodes N1 and N2, that is, a power supply voltage Vdds for a sense amplifier 47, is 2.0V. An amplitude voltage of the write mask signal WM1 is 2.0V.

Since even when either the node N2 or N1 is at a "H" level (power supply potential Vdds) and the write mask signal WM1 is at a "H" level (power supply voltage Vdds), a potential of the drain of the N channel MOS transistor 12 or 14 attains Vdds–Vth (Vth: threshold voltage of the N channel MOS transistors 11 and 13), a breakdown voltage of the gate oxide films of the N channel MOS transistors 12 and 14 should be not less than Vdds–Vth.

Figure 10:
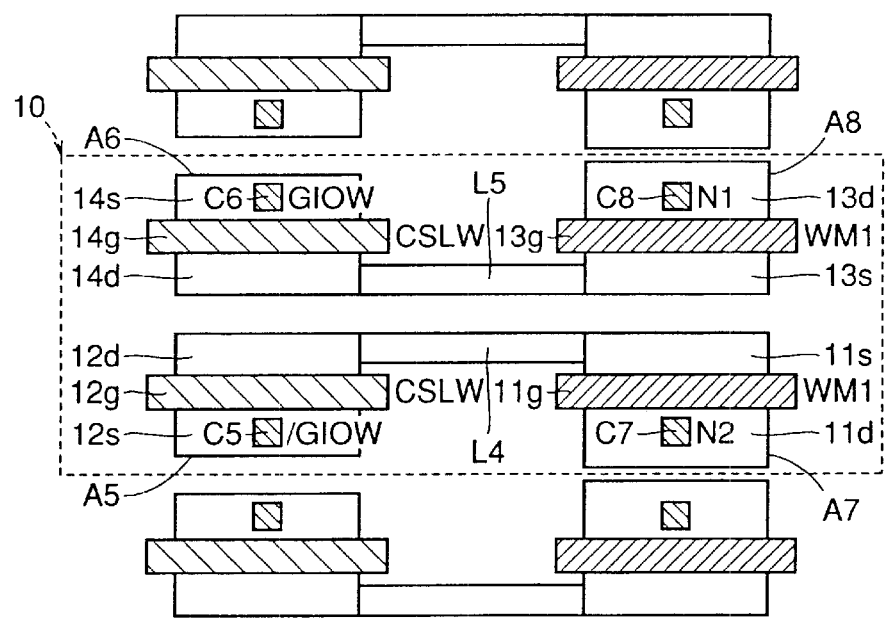
FIG. 10 is a diagram showing layout of the write gate shown in FIG. 9.
Figure 11:
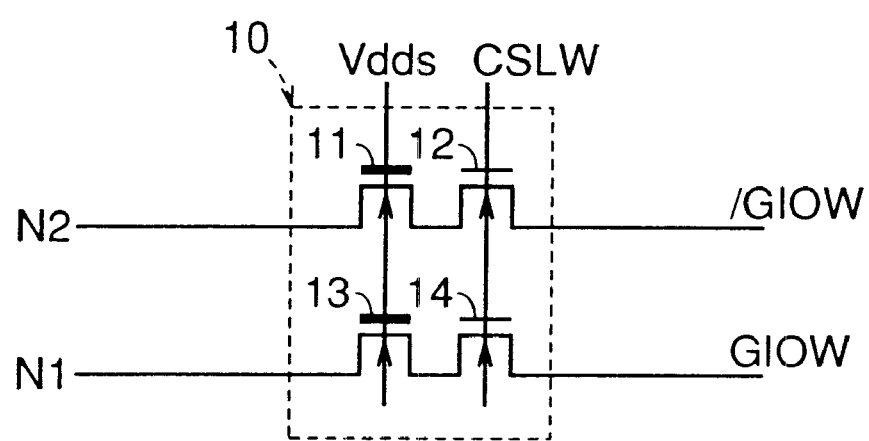
FIG. 11 is a circuit diagram showing a modification of the fifth embodiment of the present invention.
Figure 12:
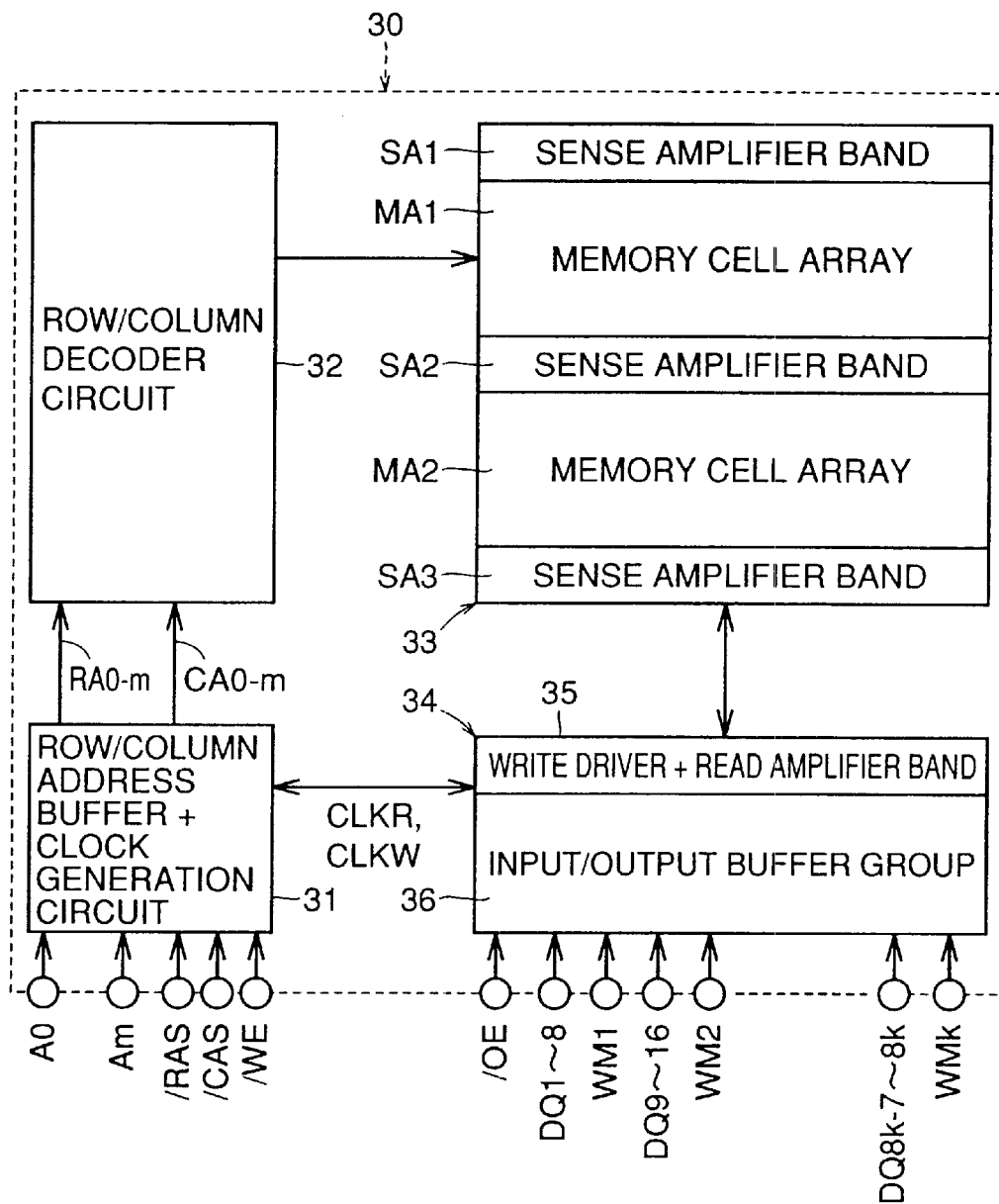
FIG. 12 is a block diagram showing the entire structure of a conventional DRAM core cell.
Figure 13:
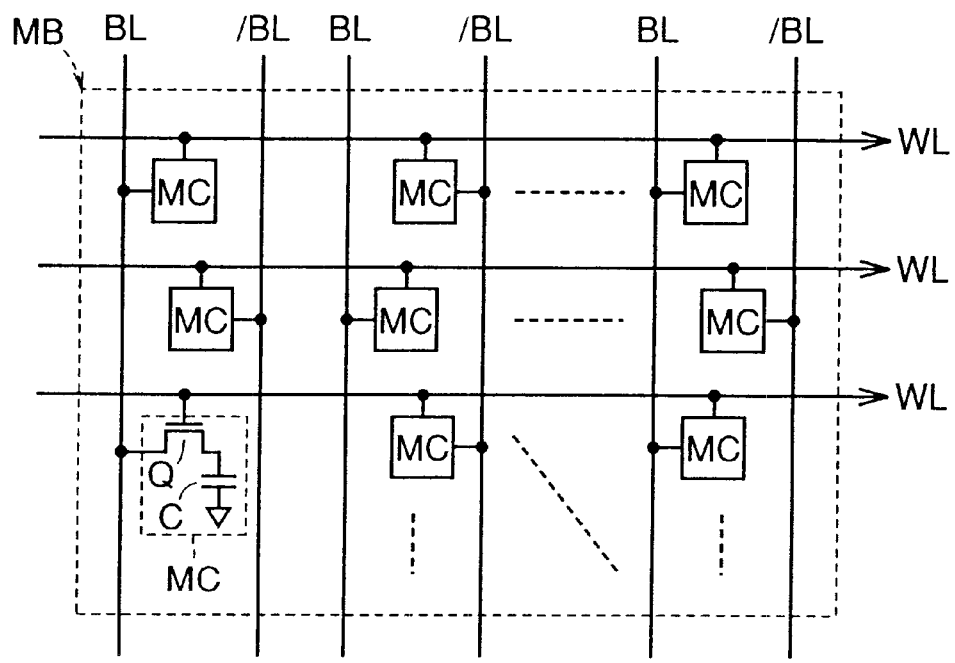
FIG. 13 is a circuit block diagram showing a structure of a memory block included in a memory cell array shown in FIG. 12.

FIG. 10 is a diagram showing layout of the write gate 10 illustrated in FIG. 9. In FIG. 10, formed in parallel to each other on the surface of a semiconductor substrate with a thick gate oxide film provided therebetween are gate electrodes 11g and 13g of the N channel MOS transistors 11 and 13. Also formed in parallel to each other on the surface of the semiconductor substrate with a thin gate oxide film provided therebetween are two gate electrodes 12g and 14g of the N channel MOS transistors 12 and 14. The gate electrodes 11g and 12g, and 13g and 14g are respectively formed at predetermined intervals on the same straight lines. The gate electrodes 11g and 13g both receive the write mask signal WM1 and the gate electrodes 12g and 14g both receive the column selecting signal CSLW.

On opposite sides of the gate electrodes 12g, 14g, 11g and 13g, active regions A5 to A8 are formed. In the active regions A5 and A6, regions between the gate electrodes 12g and 14g form drains 12d and 14d of the N channel MOS transistors 12 and 14, respectively, and regions outside the gate electrodes 12g and 14g form sources 12s and 14s of the N channel MOS transistors 12 and 14, respectively. In the active regions A7 and A8, regions between the gate electrodes 11g and 13g form sources 11s and 13s of the N channel MOS transistors 11 and 13, respectively, and regions outside the gate electrodes 11g and 13g form drains 11d and 13d of the N channel MOS transistors 12 and 13, respectively.

The drain 12d of the N channel MOS transistor 12 and the source 11s of the N channel MOS transistor 11 are connected by an interconnection layer L5 formed of an active region. The drain 14d of the N channel MOS transistor 14 and the source 13s of the N channel MOS transistor 13 are connected by an interconnection layer L6 formed of an active region. The sources 12s and 14s of the N channel MOS transistors 12 and 14 are connected to the upper layer write data lines /GIOW and GIOW through contact holes C5 and C6, respectively. The drains 11d and 13d of the N channel MOS transistors 11 and 13 are connected to nodes N2 and N1 through contact holes C7 and C8, respectively.

In the fifth embodiment, since of the four N channel MOS transistors 11 to 14 included in the write gate 10, as the two N channel MOS transistors 12 and 14 which receive the column selecting signal CSLW at their gates, thin gate insulation films are used, it is possible to set an amplitude voltage of the column selecting signal to be the same low voltage as that of a peripheral power supply to enable reduction in electricity consumption. In addition, since even if an amplitude voltage of the column selecting signal CSLR is lowered, no level converting circuit is necessary for increasing the amplitude voltage, no reduction in writing operation is involved. Also, because a large source-drain current can be obtained by the column selecting signal CSLW of a low voltage, the N channel MOS transistors 12 and 14 can be made small in size. Furthermore, because an amplitude voltage of the write data line pair GIOR, /GIOR is set to be as low as that of the peripheral power supply, a drastic reduction in electricity consumption is possible.

In addition, the two kinds of N channel MOS transistors whose gate oxide film thicknesses are different, the transistors 11 and 12, and 13 and 14, are respectively formed of separate active regions A7 and A5, and A8 and A6, which are connected by the interconnection layers L1 and L2, respectively. It is accordingly possible to separately form the active regions A7 and A5, and A8 and A6, thereby improving reliability. Layout with the smallest area is also enabled.

In a DRAM core cell failing to have the write mask signal WM1, the power supply potential Vdds for the sense amplifier 47 may be applied in place of the signal WM1 to the gates of the N channel MOS transistors 11 and 13. Also in this case, the potentials of the drains of the N channel MOS transistors 12 and 14 attain Vdds−Vth, so that a breakdown voltage of the gate oxide films of the N channel MOS transistors 12 and 14 should be not less than Vdds−Vth.

Although the present invention has been described and illustrated in detail, it is clearly understood that the same is by way of illustrations and example only and is not to be taken by way of limitation, the spirit and scope of the present invention being limited only by the terms of the appended claims.

What is claimed is:

1. A semiconductor device comprising:
   a first signal line supplied with a signal having one level at a first potential and the other level at a reference potential,
   a second signal line precharged to a second potential predetermined,
   a first MOS transistor having an input electrode connected to said first signal line and responsive to a potential of the first signal line exceeding a threshold potential of the first MOS transistor to become conductive, and
   a second MOS transistor responsive to application of a control signal allowing a signal on said first signal line to be transmitted onto said second signal line to become conductive to connect said first MOS transistor between said second signal line and a line of said reference potential, wherein a gate oxide film of said second MOS transistor is formed to be thinner than a gate oxide film of said first MOS transistor.

2. The semiconductor device according to claim 1, wherein
   each MOS transistor includes a gate oxide film and an active region formed on the surface of a semiconductor substrate, and
   an active region of said first MOS transistor and an active region of said second MOS transistor are formed separately from each other.

3. The semiconductor device according to claim 1, further comprising:
   a third signal line supplied with a complementary signal of a signal applied to said first signal line,
   a fourth signal line precharged to said second potential,
   a third MOS transistor having an input electrode connected to said third signal line and responsive to a potential of the third signal line exceeding a threshold potential of the third MOS transistor to become conductive, and
   a fourth MOS transistor responsive to application of said control signal to become conductive to connect said third MOS transistor between said fourth signal line and the line of said reference potential, wherein a gate oxide film of said fourth MOS transistor is formed to be thinner than a gate oxide film of said third MOS transistor.

4. The semiconductor device according to claim 3, wherein
   each MOS transistor includes a gate oxide film and an active region formed on the surface of a semiconductor substrate, and
   each active region of said first and third MOS transistors, and each active region of said second and fourth MOS transistors are formed separately from each other.

5. The semiconductor device according to claim 1, wherein
   said first and second MOS transistors are connected in series between said second signal line and the line of said reference potential, and further comprising:
   a third signal line supplied with a complementary signal of a signal applied to said first signal line,
   a fourth signal line precharged to said second potential, and
   a third MOS transistor having a first electrode connected to said fourth signal line, a second electrode connected to a node between said first and second MOS transistors and an input electrode connected to said third signal line, and responsive to a potential of the third signal line exceeding a threshold potential of the third MOS transistor to become conductive, and wherein
   a gate oxide film of said second MOS transistor is formed to be thinner than a gate oxide film of said third MOS transistor.

6. The semiconductor device according to claim 5, wherein
   each MOS transistor includes a gate oxide film and an active region formed on the surface of a semiconductor substrate, and
   each active region of said first and second MOS transistors, and each active region of said third MOS transistor are formed separately from each other.

* * * * *